United States Patent
Bach et al.

(10) Patent No.: US 7,339,419 B2
(45) Date of Patent: Mar. 4, 2008

(54) FILTER CIRCUIT ARRAY

(75) Inventors: Elmar Bach, Villach (AT); Stefan Groiss, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/359,047

(22) Filed: Feb. 22, 2006

(65) Prior Publication Data

US 2006/0202747 A1    Sep. 14, 2006

(30) Foreign Application Priority Data

Feb. 22, 2005    (DE) .................. 10 2005 008 099

(51) Int. Cl.
*H03B 1/00* (2006.01)
*H03K 5/00* (2006.01)
*H04B 1/10* (2006.01)

(52) U.S. Cl. ...................................... 327/552; 327/553
(58) Field of Classification Search ................ 327/552, 327/553
See application file for complete search history.

(56) References Cited

U.S. PATENT DOCUMENTS 6,433,626 B1 * 8/2002 Guimaraes .................. 327/552

\* cited by examiner

*Primary Examiner*—Tuan T. Lam
*Assistant Examiner*—Diana J. Cheng
(74) *Attorney, Agent, or Firm*—Dicke, Billig & Czaja PLLC

(57) ABSTRACT

A filter circuit array is disclosed. In one embodiment, the filter circuit array includes a higher-order filter circuit array, wherein one energy storage per order of filter is provided. The transfer function of the filter circuit array has a zero formed by a first energy storage, in particular capacitor, and a double pole formed by two additional energy storages, in particular capacitors.

10 Claims, 3 Drawing Sheets

FILTER CIRCUIT ARRAY

CROSS-REFERENCE TO RELATED APPLICATION

This Utility Patent Application claims priority to German Patent Application No. DE 10 2005 008 099.5, filed on Feb. 22, 2005, which is incorporated herein by reference.

FIELD OF THE INVENTION

The invention relates to a filter circuit array, in particular a higher-order low-pass filter circuit array.

BACKGROUND

In semiconductor components, in particular, e.g., in corresponding integrated (analog or digital) computing circuits and/or semiconductor memory devices, as well as in other electric circuits or—more generally—signal-processing systems, filter circuit arrays are frequently employed, e.g., high- and/or low-pass filter circuit arrays.

A high-pass is a filter circuit array that transmits the signals including high frequencies substantially unchanged, and causes an attenuation, and as a general rule a phase advance, in signals including low frequencies.

In contrast, a low-pass is a filter circuit array wherein signals including low frequencies are substantially transmitted unchanged; in the case of signals including high frequencies, an attenuation, and as a general rule a phase lag, is caused.

Passive high- and/or low-pass filter circuit arrays include one or several resistors, and—as an energy storage—one or several capacitive components (in particular, e.g., capacitors) (and/or one or several inductive components (in particular, e.g., coils)).

In comparison, so-called active filter circuit arrays include as a general rule—besides passive components such as resistors and capacitors—one or several active components, in particular operational amplifiers.

This results in a relatively high complexity in terms of circuitry.

If several conventional filter circuit arrays are arranged in series (so-called cascading), current or voltage outputs must frequently be converted into voltage or current outputs, or current or voltage inputs into voltage or current inputs.

Here the occurrence of undesirable, parasitic filters is frequently a drawback.

Conventional filter circuit arrays in which the transfer function has a positive or negative zero frequently comprise a differentiating circuit, which may be of disadvantage in terms of stability.

For these and other reasons, there is a need for the present invention.

SUMMARY

The present invention provides a filter circuit array is disclosed. In one embodiment, the filter circuit array includes a higher-order filter circuit array, wherein one energy storage per order of filter is provided. The transfer function of the filter circuit array has a zero formed by a first energy storage, and a double pole formed by two additional energy storages.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel filter circuit array, in particular low-pass filter circuit array, in particular a circuit array whereby the above mentioned and/or other drawbacks of conventional filter circuit arrays may—at least in part—be eliminated or avoided.

In accordance with one embodiment of the invention, there is provided a filter circuit array, in particular a higher-order active filter circuit array, wherein (only) one energy storage per order of filter is provided.

The transfer function of the filter circuit array has a zero which is formed by a first energy storage, in particular capacitor, and a double pole, in particular complex double pole, which is formed by two additional energy storages, in particular capacitors.

In one embodiment of the invention, the two energy storages forming the double pole are arranged in a first control loop, and the energy storage forming the zero is arranged in a further control loop located within the first control loop.

Figure 1:
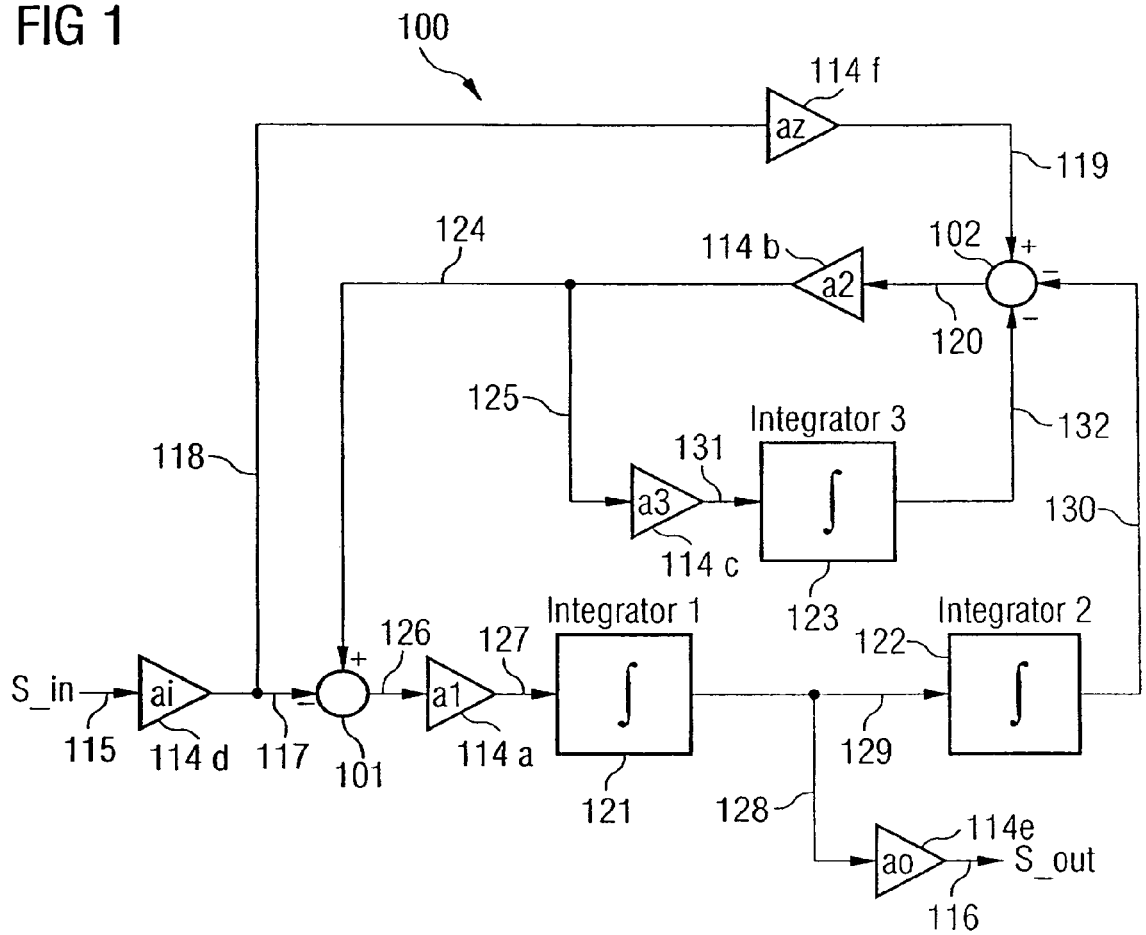
FIG. 1 illustrates a schematic, exemplary representation of a basic circuit diagram of a low-pass filter circuit array in accordance with an embodiment of the present invention.

FIG. 1 schematically and exemplarily illustrates a basic circuit diagram of a low-pass filter circuit array 100 in accordance with an embodiment of the present invention, whereby an electric (input) signal S_in (e.g., a corresponding current or voltage signal, or a signal representing any other physical quantity) present at a signal line 115 may be filtered and output on a signal line 116 as a filtered signal S_out.

As illustrated in FIG. 1, the circuit array 100 comprises several amplification elements 114a, 114b, 114c, 114d, 114e, 114f which may be formed by corresponding amplifier blocks from control technology.

The amplification elements 114a, 114b, 114c, 114d, 114e, 114f multiply the respective signals present at the inputs thereof by a particular factor (here:—in amplification element 114a by a factor a1,—in amplification element 114b by a factor a2,—in amplification element 114c by a factor a3,—in amplification element 114d by a factor a1,—in amplification element 114e by a factor ao, and—in amplification element 114f by a factor az).

Moreover, the circuit array 100 includes several subtraction elements (e.g., subtraction elements 101, 102), and several integrators (e.g., integrators 121, 122, 123).

The integrators 121, 122, 123 may, e.g., be corresponding linear integrators that integrate the respective signals present at the inputs thereof over time.

In alternative embodiments not represented here, it is also possible to omit the amplification element 114d connected to the (input) signal line 115, and/or the amplification element 114e connected with the (output) signal line 116 (the amplification elements 114d, 114e are present merely multiplicatively in the signal path of the circuit array 100 between input and output, and are not cogently necessary for realizing the filter circuit array (however they may—as will be understood from the explanations hereinbelow—result in advantages in its practical realization)).

In accordance with FIG. 1, in the present embodiment the electric signal S_in present at the signal line 115 is supplied into the input of the amplification element 114d.

The signal output at the output of the amplification element 114d and amplified by the factor ai in comparison with the input signal S_in is supplied via a signal line 118 to the input of the amplification element 114f, and via a signal line 117 to a MINUS input of the subtraction element 101.

The signal output at the output of the amplification element 114f and amplified by the factor az in comparison with the signal input to the amplification element 114f is supplied via a signal line 119 to a PLUS input 102 of the subtraction element.

As is further illustrated in FIG. 1, the signal output at the output of the subtraction element 102 on a signal line 120 is supplied to the input of the amplification element 114b.

The signal output at the output of the amplification element 114b and amplified by the factor a2 in comparison with the signal input to the amplification element 114b is supplied via a signal line 124 to a PLUS input of the subtraction element 101, and via a signal line 125 to the input of the amplification element 114c.

The subtraction element 101 subtracts the above mentioned signal present at the signal line 117 (present at the MINUS input of the subtraction element 101) from the signal present at the above mentioned signal line 124 (present at the PLUS input of the subtraction element 101).

The signal resulting from the subtraction and output at the output of the subtraction element 101 at a signal line 126 is supplied to the input of the amplification element 114a.

The signal output at the output of the amplification element 114a and amplified by the factor a1 in comparison with the signal input to the amplification element 114a is supplied via a signal line 127 to the input of the integrator 121.

The signal output at the output of the integrator 121 and integrated over time in comparison with the signal input into the integrator 121 is in the present embodiment supplied via a signal line 128 to the input of the amplification element 114e, and via a signal line 129 to the input of the integrator 122.

As is further illustrated in FIG. 1, the signal output at the output of the amplification element 114e—and amplified by the factor ao relative to the signal input into the amplification element 114e—is output at the above mentioned signal line 116 and represents the output signal S_out of the circuit array 100.

The signal supplied via the line 129 to the input of the integrator 122 is integrated over time by the latter.

The signal output at the output of the integrator 122—which has been integrated over time—is supplied via a signal line 130 to a (first) MINUS input of the subtraction element 102.

As is further illustrated in FIG. 1, the signal output at the output of the amplification element 114c and amplified by the factor a3 in comparison with the signal input into the amplification element 114c is output at a signal line 131 and supplied to the input of the integrator 123.

The signal supplied via the line 131 to the input of the integrator 123 is integrated over time by the latter.

The signal output at the output of the integrator 123—which has been integrated over time—is supplied via a signal line 132 to a (second) MINUS input of the subtraction element 102.

The subtraction element 102 subtracts the above mentioned signal present at the signal line 130 (present at the first MINUS input of the subtraction element 102), and the above mentioned signal present at the signal line 132 (present at the second MINUS input of the subtraction element 102) from the signal present at the above mentioned signal line 119 (present at the PLUS input of the subtraction element 102), and applies—as was already mentioned above—the resulting signal output at the output of the subtraction element 102 to the above mentioned signal line 120 that is connected to the amplification element 114b.

The circuit array 100 illustrated in FIG. 1 results—as will be explained in more detail in the following explanations—in the formation of a higher-order low-pass filter where the transfer function possesses an adjustable zero having an—adjustably—positive or negative sign (and thus—adjustably—phase lag or phase advance), and an equally adjustable—complex—double pole.

By selecting the quantities of the amplification factors or filter coefficients a1, a2, a3 of the amplification elements 114a, 114b, 114c it is possible to accordingly—substantially—influence the position of the complex double pole, and by selecting the quantities of the amplification factors or filter coefficients az of the amplification element 114f—substantially—influence the position of the zero (wherein there exist additional interdependencies to be considered, as will be seen from the following explanations).

The integrator 121 and the integrator 122 are—substantially—situated together with the amplification element 114a representing the amplification factor or filter coefficient a1 inside a loop closed on itself, which is necessary for the formation of a second-order resonant system, for—in terms of small signals—each one of the integrators 121, 122 taken for itself can perform a phase shift of up to 90°, and a complex double pole can only form at a phase shift of 180°.

The integrator 123 forms—together with the amplification elements 114b, 114c representing the amplification factors or filter coefficients a2 and a3—a separate feedback loop.

The latter exhibits a relatively strong high-pass behavior, for the integrator 123 is located in the feedback path, and the forward path of the loop merely consists of the amplification element 114b representing the amplification factor or filter coefficient a2.

It will be illustrated further below by referring to FIG. 2 and FIG. 3, and the detail representations in terms of circuitry shown there of the circuit arrays embodying the low-pass filter principle visualized in FIG. 1, how the above mentioned amplification factors or filter coefficients ao, a1, a2, a3, az, ai are interconnected with the corresponding parameters that are of relevance in terms of circuitry, and how the corresponding filter characteristics, in particular resonant frequencies, attenuation, position of poles or zeros, etc. result from this.

The low-pass filter principle illustrated in FIG. 1 may as an alternative also be embodied not in analog filters—as presently explained—but correspondingly in digital filters (wherein the integrators 121, 122, 123 are, e.g., replaced with up/down counters having a counting pitch in proportion with the input variable of the counter, and the analog amplification elements 114e, 114a, 114b, 114c, 114f, 114d representing the filter coefficients ao, a1, a2, a3, az, ai are, e.g., replaced with digital multipliers).

In the following, an example for a circuit array 200 embodying the low-pass filter principle explained above by referring to FIG. 1 shall be explained in more detail by referring to FIG. 2.

Figure 2:
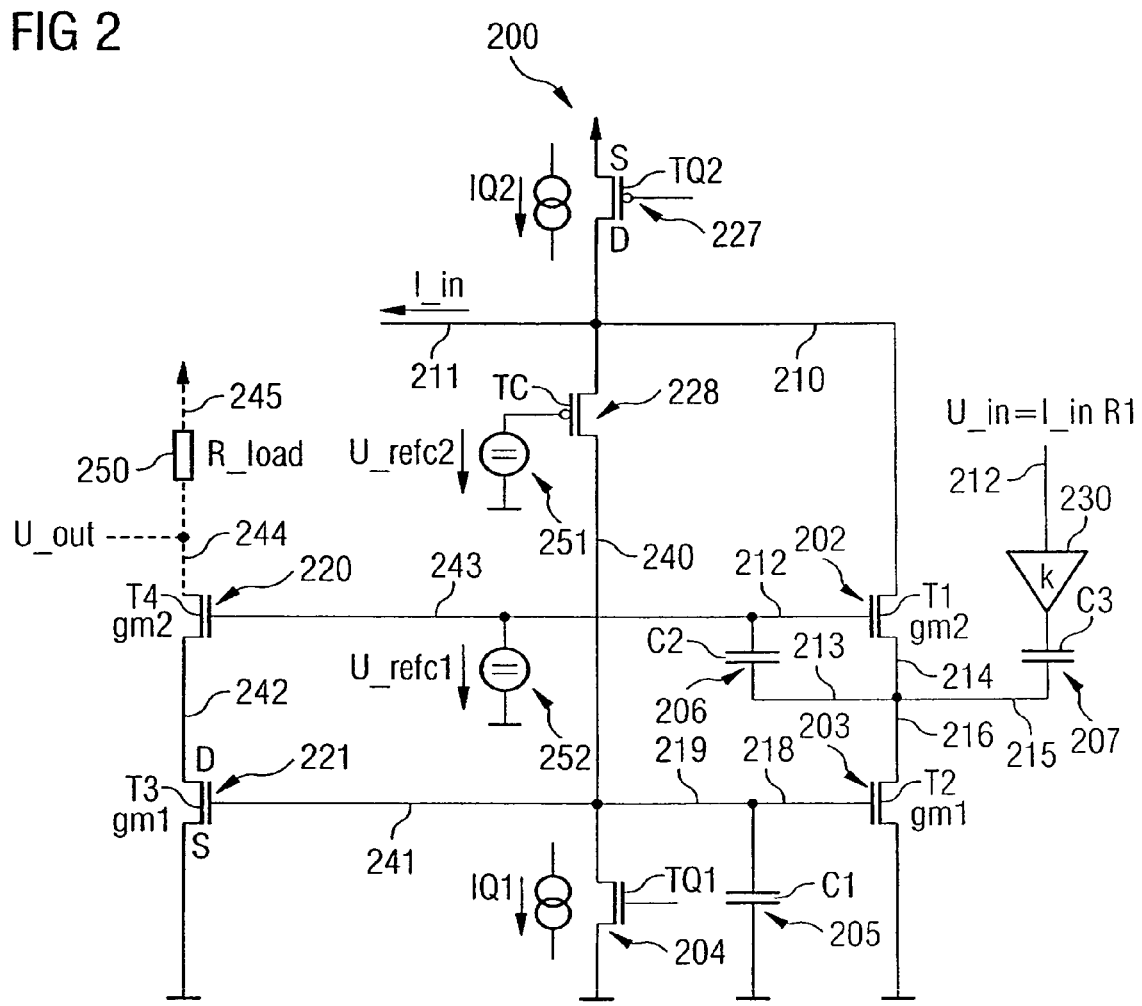
FIG. 2 illustrates a schematic, exemplary detail representation of a circuit array embodying the low-pass filter principle visualized in FIG. 1.

As is illustrated in FIG. 2, the low-pass filter circuit array 200 illustrated there comprises three n-channel field effect transistors 202, 203, 204 (transistor T1, transistor T2, and transistor TQ1), as well as two p-channel field effect transistors 227, 228 (transistor TQ2, and transistor TC), several capacitors 205, 206, 207 (here: the three capacitors C1, C2, C3) and—optionally—several additional transistors (here: the n-channel field effect transistors 220, 221 (transistor T4, and transistor T3)).

The drain of the n-channel field effect transistor 202 is connected via a line 210 with the drain of the p-channel field effect transistor 227, the source of which is coupled to the supply voltage, as well as with the source of the p-channel field effect transistor 228, and with a (input) line 211.

The gate of the n-channel field effect transistor 202 is connected via a line 212 with the capacitor 206, which is connected via lines 213, 214 with the source of the n-channel field effect transistor 202, as well as via the line 213, and a line 216 with the drain of the n-channel field effect transistor 203, and via the line 213, and a line 215 with the capacitor 207, with the latter being coupled to amplification means 230 having the source thereof connected with a line 217.

The source of the n-channel field effect transistor 203 is coupled to ground.

Furthermore, the gate of the n-channel field effect transistor 203 is coupled via a line 218 to the capacitor 205 that is—equally—coupled to ground, and via a line 219 (or the line 219 and a line 240) to the drain of the n-channel field effect transistor 204 (having its source coupled to ground), and to the drain of the p-channel field effect transistor 228.

The gate of the n-channel field effect transistor 221 is coupled via a line 241 to the drain of the n-channel field effect transistor 204 and to the drain of the p-channel field effect transistor 228, as well as to the gate of the n-channel field effect transistor 203, and to the capacitor 205.

The source of the n-channel field effect transistor 221 is coupled to ground.

The drain of the n-channel field effect transistor 221 is connected via a line 242 with the source of the n-channel field effect transistor 220.

The gate of the n-channel field effect transistor 220 is coupled via a line 243 to the gate of the n-channel field effect transistor 202, and to the capacitor 206, and the drain of the n-channel field effect transistor 220 is coupled via a line 244 to a load resistor 250 that is connected with a line 245.

The line 245 is generally connected with the (positive) supply voltage, or with a voltage which determines the DC voltage value (working point) of U_out.

As is illustrated in FIG. 2, the gate of the p-channel field effect transistor 228 is biased to a voltage U_refc2 with the aid of a voltage source 251.

Furthermore, the gate of the n-channel field effect transistor 202 (and the gate of the n-channel field effect transistor 220) is biased to a voltage U_refc1 with the aid of a voltage source 252.

In the circuit array 200 illustrated in FIG. 2, the current I_in at the line 211, which is—substantially—passed on via the n-channel field effect transistors 202 and 203 (transistors T1, T2) as a signal current, serves as an input signal.

The p-channel field-effect transistor 227 (transistor TQ2) acts as a current source (current IQ2); such current source may—in alternative embodiments not shown here—also be configured or embodied with a corresponding difference from the representation in FIG. 2.

The p-channel field-effect transistor 228 (transistor TC) serves as a cascode for maintaining the input node connected with the line 211 at a predefined potential.

As is furthermore illustrated in FIG. 2, the n-channel field-effect transistor 204 (transistor TQ1) acts as a current sink (current IQ1); the n-channel field effect transistors 202 and 203 (transistors T1, T2) are thus coursed through by a current which results from the difference between the above mentioned currents IQ2 and IQ1 and the above mentioned current I_in.

As a result of biasing the n-channel field effect transistor 202 (transistor T1) in the above mentioned manner with the aid of the voltage source 252, the gate of the former is maintained constant at the above mentioned voltage U_refc1.

The n-channel field-effect transistor 202 (transistor T1) acts as a cascode.

By the circuit array 200 illustrated in FIG. 2 a higher-order low-pass filter is created, wherein the transfer function has an adjustable zero with an—adjustably—positive or negative sign (and thus—adjustably—phase lag or phase advance), and an equally adjustable—complex—double pole:

The field effect transistors 202, 203, 204, 227 and 228 (transistor T1, T2, TQ1, TQ2 and TC) form a control loop closed on itself, which has a very high amplification.

Inside the loop, the above mentioned—complex—double pole is formed by the capacitance C1 of the capacitor 205, the capacitance C2 of the capacitor 206, the steepness gm1 of the drain-source current of the field effect transistor 203, and the steepness gm2 of the drain-source current of the field effect transistor 202.

In the circuit array illustrated in FIG. 2, the n-channel field effect transistors 221, 220 (transistors T3, T4) and the load resistor 250 are not cogently necessary for the actual filtering function; they serve for coupling out and further processing of the output signal (here: the voltage U_out which may be tapped at the line 244).

Thus on the one hand the possibility of cascading filter blocks may be achieved (i.e., the possibility of a serial arrangement of several (identical or similar) circuit arrays corresponding to the circuit array 200 illustrated in FIG. 2); on the other hand a linear signal amplification may be realized.

As is illustrated in FIG. 2, in order to realize the above mentioned zero, an additional signal is fed into the circuit array 200, namely, a voltage U_in present at the above mentioned line 217, which is selected in proportion with the above mentioned current I_in (and may be obtained from the current I_in in accordance with the relationship U_in=R1 I_in by using a corresponding resistor).

With the aid of the amplification means 230, the signal (here: the voltage U_in) present at the line 217 (i.e., at the input of the amplification means 230) is amplified by a particular amplifier factor k, and the amplified signal is passed on to the capacitor 207 having a capacitance C3.

By means of the amplifier factor k—which may be positive or negative—it is possible to adjust the sign of the above mentioned zero.

The filter coefficients ao, a1, a2, a3, az, ai mentioned above in connection with FIG. 1, and the circuit array 100 illustrated there, have the following relationships with the circuit parameters of the circuit array 200 illustrated in FIG. 2:

$$ai = 1/R1$$

$$ao = -gm1/gm2$$

$$az = K\ R1C3/gm1$$

$$a1 = 1/C1$$

$$a2 = gm1gm2/(C2+C3)$$

$$a3 = 1/gm1$$

From this the resonant frequency of the double pole system results as $$f_0 = \frac{1}{2\pi}\sqrt{\frac{gm1gm2}{C1(C2+C3)}}$$

and the attenuation as $$\zeta = \frac{1}{2}\sqrt{\frac{gm2C1}{gm1(C2+C3)}}$$

The positive/negative zero results as $$f_z = \frac{gm2}{2\pi(C2+C3-kR1gm2C3)}$$

By suitably selecting the amplifier factor k (positive, or negative) it is possible to correspondingly adjust the zero frequency to be positive or negative, which will—in the case of a positive zero—result in a phase advance and—in the case of a negative zero—in a phase lag in the overall transfer function of the filter circuit array 200.

As an example for a relatively simple realization of a positive or negative amplifier factor k it may be indicated that the circuit array 200 illustrated in FIG. 2 is—in a corresponding manner—additionally built up one more time (additional circuit array 200'—not represented—), thus altogether resulting in a differential filter stage.

If the input of the amplification means 230 of the circuit array 200, and the input of the—corresponding—additional amplification means 230' of the additional circuit array 200' is alternatively linked with one or the other input current of the differential stage, the sign of k changes.

As results from the above given formulae, the configuration of the filter's resonant frequency may on the one hand be achieved through the selection of the transistor-steepness gm1 and/or gm2 of the field effect transistor 202 and/or 203.

On the other hand, the capacitances C1 and/or C2 and/or C3 of the capacitors 205 and/or 206 and/or 207 may also be altered correspondingly; as an alternative, any combinations of these possibilities are also conceivable.

In order to adjust the values for gm1 and/or gm2 and/or C1 and/or C2 and/or C3, in principle any analog or digital circuits may be used; particularly for an adjustment of the capacitances C1 and/or C2 and/or C3, the utilization of corresponding digital circuits is advantageous (whereby the corresponding values may be programmed digitally).

Particularly in applications where the filter circuit array 200 is embedded in larger systems, simple digital programming of the filter properties is highly useful.

What was said above analogously also applies to the adjustment of the coefficients of the zero (k, R1), etc.

In another alternative variant of the circuit array 200, the transistors provided there may, e.g., also be executed in bipolar or BiCMOS technology instead of NMOS or PMOS technology like in the above explained embodiment.

As an alternative, e.g., a complementary realization of the circuitry is also conceivable, wherein PMOS transistors are used instead of NMOS transistors, and vice versa NMOS transistors are used instead of PMOS transistors.

An additional, alternative example for a circuit array 1200 embodying the low-pass filter principle explained above by referring to FIG. 1 will in the following be explained in more detail by reference to FIG. 3.

Figure 3:
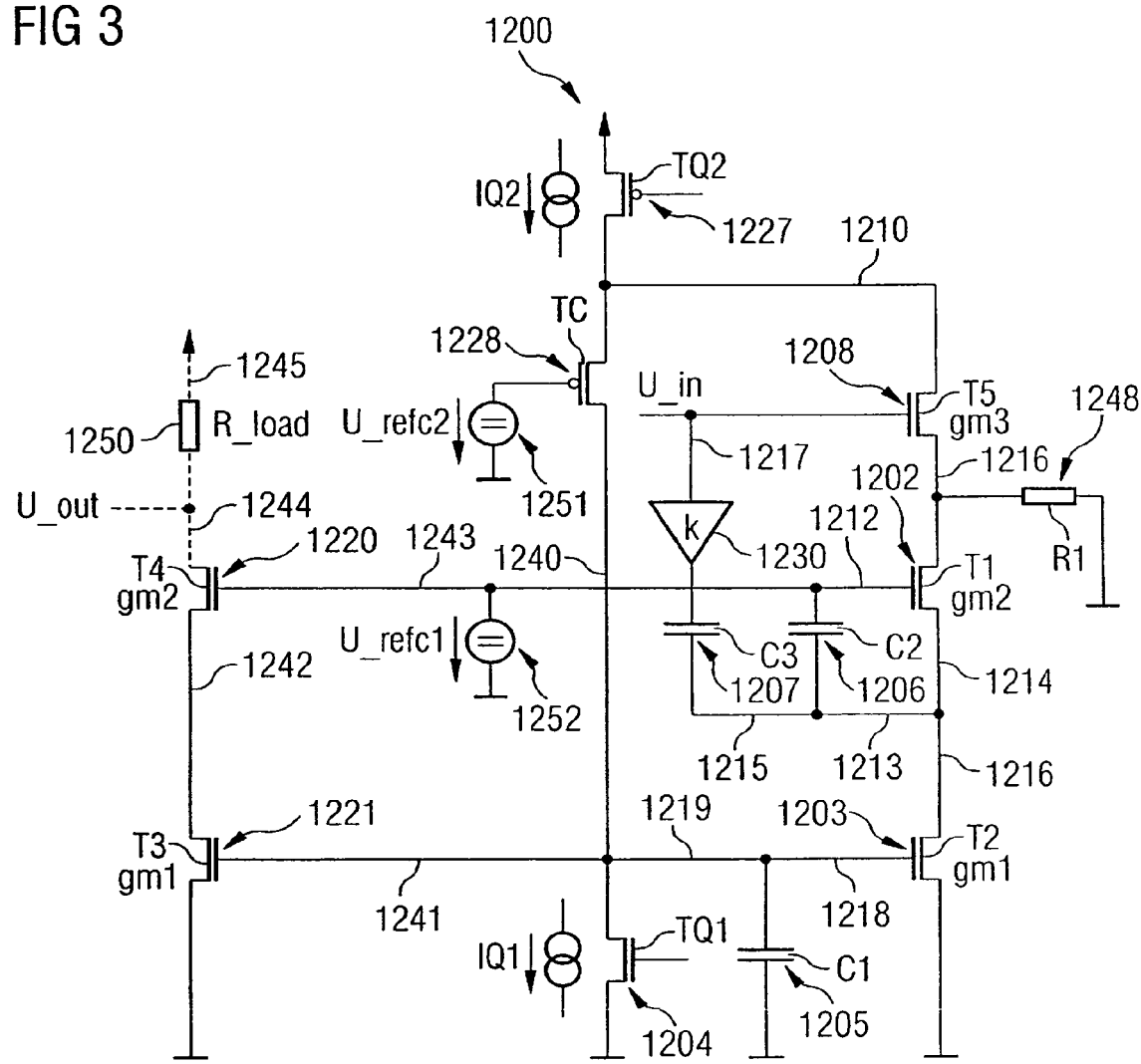
FIG. 3 illustrates a schematic, exemplary detail representation of another, alternative circuit array embodying the low-pass filter principle represented in FIG. 1.

As is illustrated in FIG. 3, the low-pass filter circuit array 1200 illustrated there comprises four n-channel field effect transistors 1202, 1203, 1208, 1204 (transistor T1, transistor T2, transistor T5, and transistor TQ1), as well as two p-channel field effect transistors 1227, 1228 (transistor TQ2, and transistor TC), several capacitors 1205, 1206, 1207 (here: the three capacitors C1, C2, C3) and—optionally—several additional transistors (here: the n-channel field effect transistors 1220, 1221 (transistor T4, and transistor T3)).

The drain of the n-channel field effect transistor 1208 is connected via a line 1210 with the drain of the p-channel field effect transistor 1227, the source of which is coupled to the supply voltage, as well as with the source of the p-channel field effect transistor 1228.

The gate of the n-channel field effect transistor 1208 is connected via a line 1217 with amplification means 1230.

Furthermore, the source of the n-channel field effect transistor 1208 is connected via a line 1247 with a resistor 1248—which comprises an ohmic resistor R1 and is coupled to ground—as well as with the drain of the n-channel field effect transistor 1202.

The gate of the n-channel field effect transistor 1202 is connected via a line 1212 with the capacitor 1206 that is connected, via lines 1213, 1214, with the source of the n-channel field effect transistor 1202, as well as via the line 1213, and a line 1216 with the drain of the n-channel field effect transistor 1203, and via a line 1215 with the capacitor 1207 that is coupled to the output of the above mentioned amplification means 1230.

The source of the n-channel field effect transistor 1203 is coupled to ground.

Furthermore, the gate of the n-channel field effect transistor 1203 is coupled via a line 1218 to the capacitor 1205 that is—equally—coupled to ground, and via a line 1219 (or the line 1219, and a line 1240) to the drain of the n-channel field effect transistor 1204 (the source of which is coupled to ground), and to the drain of the p-channel field effect transistor 1228.

The gate of the n-channel field effect transistor 1221 is coupled via a line 1241 to the drain of the n-channel field effect transistor 1204 and to the drain of the p-channel field effect transistor 1228, as well as to the gate of the n-channel field effect transistor 1203, and to the capacitor 1205.

The source of the n-channel field effect transistor 1221 is coupled to ground.

The drain of the n-channel field effect transistor 1221 is connected via a line 1242 with the source of the n-channel field effect transistor 1220.

The gate of the n-channel field effect transistor 1220 is coupled via a line 1243 to the gate of the n-channel field effect transistor 1202, and to the capacitor 1206, and the drain of the n-channel field effect transistor 1220 is coupled via a line 1244 to a load resistor 1250 connected with a line 1245.

The line 1245 is generally connected with the (positive) supply voltage, or with a voltage which determines the DC voltage value (working point) of U_out.

As is illustrated in FIG. 3, the gate of the p-channel field effect transistor 1228 is biased to a voltage U_refc2 with the aid of a voltage source 1251.

Moreover, the gate of the n-channel field effect transistor 1202 (and the gate of the n-channel field effect transistor 1220) is biased to a voltage U_refc1 with the aid of a voltage source 1252.

In the circuit array 1200 illustrated in FIG. 3, the voltage U_in present at the line 1217 serves as an input signal (and thus as a difference from the circuit array 200 illustrated in FIG. 2 not a current signal (there: the current I_in present at the line 211), but a voltage signal). For the rest, the filter configuration of the circuit array 1200 illustrated in FIG. 3 is substantially identical in the basic approach with the one of the circuit array 200 illustrated in FIG. 2: in particular both circuit arrays 200, 1200 have a substantially identical signal path.

Nevertheless, due to the additional use of the n-channel field effect transistor 1208 (transistor T5) and of the resistor 1248 (resistor R1) the filter characteristic frequencies change.

The resonant frequency results as $$f_0 = \frac{1}{2\pi}\sqrt{\frac{gm1\,gm2\,gm3\,R1}{C1(C2+C3)(1+gm3R1)}}$$

and the attenuation as $$\zeta = \frac{1}{2}\sqrt{\frac{gm2\,C1(1+gm3R1)}{gm1(C2+C3)gm3R1}}$$

For the positive/negative zero there applies (identically with the circuit array illustrated in FIG. 2):

$$f_z = \frac{gm2}{2\pi(C2+C3-kR1gm2C3)}$$

In a correspondingly similar way as in the circuit array 200 illustrated in FIG. 2, the sign of the zero may also be changed in the circuit array 1200 illustrated in FIG. 3 (in particular so as to result in a negative zero (and a negative amplifier factor k)), by correspondingly building up the circuit array 1200 illustrated in FIG. 3 (filter stage) an additional time (additional circuit array 1200' (additional filter stage)—not represented—) and differentially interleaving the two filter stages with each other.

The input of the amplification means 1230 of the circuit array 1200 is then on the one hand connected with the line 1217 (as is also represented in FIG. 3), and—additionally—on the other hand with a line 1217' (corresponding to the line 1217) of the amplification means 1230' (corresponding to the amplification means 1230 and equally not represented) of circuit array 1200'.

Correspondingly, the input of the amplification means 1230' of the circuit array 1200' is on the one hand connected with the line 1217', and—additionally—on the other hand with the 1217 of the amplification means 1230, whereby the positive or negative zero is realized, respectively.

Furthermore, the resistor 1248 (resistor R1) of the circuit array 1200 is then not—as illustrated in FIG. 3—connected with ground, but—in mirror symmetry—coupled to the further circuit array 1200' (in particular to the resistor 1248' (resistor R1', equally not represented) provided there in a corresponding manner (also not connected with ground in difference from the representation in FIG. 3)), thus resulting altogether in a perfectly symmetrical circuit.

In another alternative variant of the circuit array 1200 illustrated in FIG. 3, the transistors provided there may, e.g., also be executed in bipolar or BiCMOS technology instead of NMOS or PMOS technology like in the above explained embodiment, etc.

As an alternative, e.g., a complementary realization of the circuitry is also conceivable, wherein PMOS transistors are used instead of NMOS transistors, and vice versa NMOS transistors instead of PMOS transistors.

In further, alternative variants a multiplicity (e.g., two, three or more) of the filter circuit arrays 200, 1200 illustrated in FIG. 2 or 3 may be arranged in series (cascading), wherein—as a difference from the prior art—the occurrence of undesirable parasitic filters may be prevented. Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A filter circuit array comprising:
a higher-order filter circuit having only one energy storage per order of filter and having a transfer function with a double pole formed by a first integrator and a second integrator, wherein the first integrator and second integrator each comprise an energy storage and are arranged together in a first control loop, and a zero formed by a further integrator, wherein the further integrator comprises an energy storage and is arranged in an additional control loop arranged inside the first control loop.

2. The filter circuit array in accordance with claim 1, wherein the higher-order filter circuit comprises a second or higher order.

3. The filter circuit array in accordance with claim 1, wherein per order of filter one integrator respectively comprising one of the energy storages is provided.

4. The filter circuit array in accordance with claim 3, wherein at least one of the integrators provided per order of filter additionally comprises a transistor.

5. The filter circuit array in accordance with claim 1, wherein the energy storages comprise capacitors.

6. The filter circuit array in accordance with claim 1, comprising wherein the energy storage comprises a capacitor, an integrator, or capacitor and transistor.

7. The filter circuit array in accordance with claim 1, wherein the position of the zero is adjustable.

8. The filter circuit array in accordance with claim 1, wherein the position of the double pole is adjustable.

9. The circuit array in accordance with claim 1, which does not include any operational amplifiers.

10. A filter circuit array comprising:
a higher-order active filter circuit array, wherein only one energy storage device per order of filter is provided, wherein a transfer function of the filter circuit array has a zero formed by a first energy storage device and a complex double pole formed by two additional energy storage devices; and wherein the two energy storage devices forming the double pole are arranged in a first control loop, and the energy storage device forming the zero is arranged in a further control loop arranged within the first control loop.

* * * * *